(12) United States Patent
McAllister et al.

(10) Patent No.: US 7,930,820 B2
(45) Date of Patent: Apr. 26, 2011

(54) METHOD FOR STRUCTURAL ENHANCEMENT OF COMPRESSION SYSTEM BOARD CONNECTIONS

(75) Inventors: Michael F. McAllister, New Milford, CT (US); Harald Pross, Wildberg (DE); Gerhard H. Ruehle, Sindelfingen (DE); Wolfgang A. Scholz, Starzach (DE); Gerhard Schoor, Dettenhausen (DE)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 11/234,986

(22) Filed: Sep. 26, 2005

(65) Prior Publication Data
US 2007/0069754 A1    Mar. 29, 2007

(51) Int. Cl.
*H05K 13/00* (2006.01)
*H05K 1/18* (2006.01)
(52) U.S. Cl. ............. 29/830; 29/831; 361/715; 361/720
(58) Field of Classification Search ............ 29/830, 29/831, 841; 439/65–66, 91, 86; 174/259–261; 361/803, 699, 719, 704, 707, 713, 720, 715
See application file for complete search history.

(56) References Cited

U.S. PATENT DOCUMENTS

| | | | | |
|---|---|---|---|---|
| 3,586,102 | A * | 6/1971 | Gilles | 165/186 |
| 4,886,461 | A | 12/1989 | Smith | |
| 4,911,974 | A * | 3/1990 | Shimizu et al. | 428/143 |
| 5,218,972 | A * | 6/1993 | Gorsuch et al. | 600/588 |
| 5,492,219 | A * | 2/1996 | Stupar | 206/219 |
| 5,563,769 | A | 10/1996 | MacGregor | |
| 5,640,303 | A * | 6/1997 | Hooley | 361/699 |
| 5,735,040 | A | 4/1998 | Ochi et al. | |
| 6,203,541 | B1 | 3/2001 | Keppel | |
| 6,251,660 | B1 | 6/2001 | Muir et al. | |
| 6,313,598 | B1 * | 11/2001 | Tamba et al. | 318/722 |
| 6,339,875 | B1 | 1/2002 | Larson | |
| 6,506,189 | B1 | 1/2003 | Rittman, III et al. | |
| 6,531,771 | B1 | 3/2003 | Schoenstein et al. | |

(Continued)

FOREIGN PATENT DOCUMENTS

DE    10224154    12/2003

(Continued)

OTHER PUBLICATIONS

Hong et al., The Electrical Properties of Silicone Gel due to Curing Condition, 1997, IEEE, Jun. 22-25, 1998, pp. 218-220.*

(Continued)

*Primary Examiner* — A. Dexter Tugbang
*Assistant Examiner* — Livius R Cazan
(74) *Attorney, Agent, or Firm* — William A. Kinnaman, Jr.

(57) ABSTRACT

A MCM system board uses a stiffener arrangement to enhance mechanical, thermo and electrical properties by incorporating an LGA compression connector in a computer system. The present designs of large scale computing systems (LSCS) in IBM use a MCM that is attached to a system board and held together by a stiffening frame. Due to the nature of the manufacturing of the system board, there can be significant gaps formed in the mounting area of the MCM between the board and the stiffener. A method is described that not only fills the void, it also, in addition promotes thermo conduction of excess heat away from the MCM and at the same time promotes enhanced electrical properties of the LGA connections of the MCM to the system board.

13 Claims, 5 Drawing Sheets

U.S. PATENT DOCUMENTS

| | | | |
|---|---|---|---|
| 6,707,671 B2 * | 3/2004 | Yamashita et al. | 361/704 |
| 6,711,811 B2 * | 3/2004 | Hensley et al. | 29/836 |
| 6,743,026 B1 * | 6/2004 | Brodsky | 439/73 |
| 6,770,967 B2 | 8/2004 | Garcley | |
| 6,947,293 B2 | 9/2005 | DiBene, II et al. | |
| 7,245,023 B1 | 7/2007 | Lin | |
| 7,344,919 B2 | 3/2008 | McAllister et al. | 438/108 |
| 7,541,265 B2 | 6/2009 | Das et al. | |
| 7,543,373 B2 | 6/2009 | McAllister et al. | |
| 2002/0189858 A1 | 12/2002 | Hensley et al. | |
| 2002/0196085 A1 | 12/2002 | Nakamata et al. | |
| 2003/0042624 A1 * | 3/2003 | Shinohara | 257/787 |
| 2003/0057534 A1 | 3/2003 | Ho et al. | |
| 2004/0037044 A1 | 2/2004 | Cook et al. | |
| 2004/0181216 A1 | 9/2004 | Kelly et al. | |
| 2004/0256731 A1 | 12/2004 | Mao et al. | |
| 2005/0035452 A1 | 2/2005 | Zhang et al. | |
| 2005/0092478 A1 | 5/2005 | Jairazbhoy et al. | |
| 2006/0030197 A1 | 2/2006 | Brodsky | |
| 2006/0264756 A1 * | 11/2006 | Lo et al. | 600/459 |

FOREIGN PATENT DOCUMENTS

| | | |
|---|---|---|
| FR | 2864439 | 7/2005 |
| WO | WO 9922657 | 5/1999 |

OTHER PUBLICATIONS

"The Electrical Properties of Silicone Gel Due to Curing Condition", by Nung-Pyo Hong, 1998 IEEE International Conference on Conduction and Breakdown in Solid Dielectrics, Jun. 22-25, 1998, Sweden, pp. 218-220.

U.S. Appl. No. 11/234,985, Non-Final Office Action mailed Oct. 25, 2007.
U.S. Appl. No. 11/234,985, Election/Restriction Requirement mailed May 14, 2008.
U.S. Appl. No. 11/234,985, Office Communication mailed Nov. 14, 2008.
U.S. Appl. No. 11/234,883, Non-Final Office Action mailed Apr. 24, 2007.
U.S. Appl. No. 11/234,883, Notice of Allowance mailed Oct. 18, 2007.
U.S. Appl. No. 11/234,883, Response to Rule 312 mailed Dec. 31, 2007.
U.S. Appl. No. 11/234,884, First Action Interview mailed Aug. 10, 2010.
U.S. Appl. No. 11/949,107, Non-Final Office Action mailed May 11, 2009.
U.S. Appl. No. 11/949,107, Non-Final Office Action mailed Dec. 3, 2009.
U.S. Appl. No. 11/949,107, Final Office Action mailed Jun. 4, 2010.
U.S. Appl. No. 11/234,885, Non-Final Office Action mailed Nov. 6, 2007.
U.S. Appl. No. 11/234,885, Final Office Action mailed Mar. 27, 2008.
U.S. Appl. No. 11/234,885, Non-Final Office Action mailed Sep. 11, 2008.
U.S. Appl. No. 11/234,885, Advisory Action mailed Nov. 6, 2008.
U.S. Appl. No. 11/234,885, Notice of Allowance mailed Feb. 9, 2009.
European Search Report from EP 05025423.4 mailed Jan. 19, 2007.

* cited by examiner

US 7,930,820 B2

METHOD FOR STRUCTURAL ENHANCEMENT OF COMPRESSION SYSTEM BOARD CONNECTIONS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to a gel package structural enhancement of compression system board connections, and particularly to the mechanical, electrical, and thermo improvements to computer systems that utilize LGA compression connector techniques on system boards.

2. Description of Background

In the present construction of the IBM Z-series systems as well as in other programs such as the IBM P-series, the Multi-chip module (MCM) is compressed to the main system board using a mechanical encapsulated MCM structure and a Land Grid Array (LGA) type connection. There has developed with the advent of large scale computing systems, like these mentioned, that a unique problem can be recognized in the construction of the PCB system board. When the system board is fabricated, a change in thickness is produced in the areas of large arrays of vias or plated thru holes (PTH). With this change in thickness, support for a compression style connection scheme such as a Land Grid Array (LGA) can cause many problems. For one, a significant space or gap will develop between the system board and the supporting fixture or stiffener. This gap would then cause instability or flexing of the board, due to expansion and contraction produced by the thermo properties of the system board. To compound this problem, the arrangement of the high density of PTH in the system board due to the design of the I/O pattern of the MCM would cause an uneven pattern on the system board. In areas of low via density, the board would not contract in size as it would in areas of high via densities. In the present design of IBM's Z and P system series, the array of I/O's on the MCM is divided into four areas. This is done for several reasons, one of which is to permit the fabrication of the LGA connector used between the MCM and the system board. This then causes the system board to have different thicknesses that match the I/O pattern.

The resulting board uses then a unique insulator placed between the board and the holding fixture. At present, laminations of multiple layers of insulator arranged in a stacked pattern are used to compensate for the board's thickness change. This approach does not provide a fully supporting structure and also is limited to what size gap can be filled. If the gap exceeds a predetermined size, then the board would not be acceptable. It would be impossible to have multiple stacked insulator designs for use in the assembly of the computer system. At present the system boards are then subjected to screening so that the gap is of a specific size, so that the presently designed stacked insulator is usable.

Furthermore, to achieve the best mechanical interface and electrical connections, it is required that the system board along with its stiffener be as flat as possible in the LGA area. This requirement can significantly increase the total cost of the delivered boards from the PBC vendor as well as the overall cost to produce the computer system. The stringent requirement for board flatness will result in the sorting of the PBC boards based on measurements made after manufacturing. In addition, to this, to insure a sound mechanical interface, all the supporting mechanical structures such as the MCM mounting hardware, and stiffener have to be controlled to very tight tolerances. At present there is a significant gap between the bottom side of the system board and the stiffener. This is caused by a change in thickness of the system board in the area of the MCM interface.

The main reason for the thickness difference of the printed circuit board (PCB) in the LGA area is due to the number of plated thru holes (PTH) or vias in that area. With a large number of vias in any given area shrinkage occurs on both sides of the PCB board. The larger the number of vias in any area on the board, a corresponding larger shrinkage area is produced. For some MCM designs, the I/O arrays are arranged in separate array groups on the bottom side of the MCM. On the system board, there would be a corresponding arrangement of plated thru vias to permit electrical connections within the system board, and thus the system board will be thicker in the areas where there are fewer or no vias and thinner in areas with a large number of vias. Thus depending on the design for the I/O locations for the MCM it would be possible for a system board to contain a non-uniform thickness or rippled effect in the LGA area. At present, the non-planer area directly under the MCM on the topside of the system board is compensated in part, by the pliable LGA connector structure, but the area under the MCM on the stiffener side is not compensated for at all. Although there is an insulator between the system board and the stiffener, the void created by the thickness change in the LGA area is not compensated for. From mechanical analysis, it has been found that the system board will tend to have a concaved bend or thickness change of up to 0.008 inches and in some instances a large gap of 0.012 inches are created. In the LGA area, the board could also have a profile that is rippled in shape. The shape and size of the bend is variable and not always uniformed, and thus the void cannot be filled without some structural design changes. Studies indicate that the system board tends to form a dish or concave profile in the area of the high density via area.

There have been a number of suggestions to date that include a rigid preformed crowned pad that would be inserted in addition between the insulator and the system board or for additional sheets of Mylar in a stack in the crowned area. Using this preformed crowned pad or any other such design to compensate for the irregularities in the LGA area would work for a dish or concave shape of one size, but not for an uneven or structures with multiple topology differences. With the natural creation of the void or dishing on the system board, great care must be used in the overall design to insure component and mechanical integrity. To help prevent the MCM module from breaking, all the mechanical uncertainties and tolerances have to be controlled in the assembling of the functional package. To insure that the LGA interface structure is in the best electrical contact, i.e. low contact resistance, the support area between the system board and the stiffener must be as rigid and solid as possible. If the mechanical system, for mounting the MCM and the electrical interface, is incorrectly compensated for, the gap on the system board could cause significant module damage or electrical contact problems. This would include cracking of the MCM or poor electrical connection through the LGA interface. At present, all suggestions fall short in the solution of these problems.

SUMMARY OF THE INVENTION

In accordance with the invention, we have developed a gel package of doughy or gel or gel paste like material formed by a first layer of film and a second layer of film enclosing our non-compressible gel paste formulated to become stiff after application of pressure causes said first and second layer to compress our non-compressible gel paste. This gel package, alone or with its framework can be manufactured and used with our MCM final assembly where application of pressure is a compression caused by mounting an MCM module to a PCB system board against a mechanical stiffener when our gel package is placed between the PCB system board and the mechanical stiffener and the MCM module and mechanical stiffener are drawn together compressing the gel package against the PCB system board.

The gel package allows for compensation of irregular thickness changes due to the design of the system board. The gel package allows use of our new methods of use of the gel package we developed and will describe. We fill the gap between the system board and its supporting hardware with a package of non-compressible gel or suitable insulating substance. As we will also illustrate, we have provided utilization of a non-compressible fluid like material in a package used as a replacement for the insulator sheets used between the system board and its stiffener. This insulator package could be composed of a lamination of Mylar, Kapcon, or some other suitable material encapsulating non-compressible materials including but not limited to thermo paste as used between the IC chips on the MCM such as Dow Corning TC-5022 or a thermo conductive, low temperature curing epoxy. In addition, the non-compressible material could be composed of any non-toxic insulating gel that would have the desired characteristics that would insure full contact support between the system board and the mechanical stiffener. This insulating package of material would conform to all the irregularities that are present between the system board and the mechanical stiffener used to support the board and MCM components. In addition, if a thermo past were used, heat removal from the bottom of the system board in the area of the MCM would be possible. If the gel or resin material had a low temperature-curing characteristic that hardens when it is heated by the temperature rise of the board in the powered on system (i.e., as a thermosetting resin), it would form a solid structure between the board and the stiffener. This hardened insulating package would require, at a later time, a new cushion to be used if the board were to be removed from the stiffener. The new arrangement enhances the overall structure of the MCM-LGA-system board-stiffener design. At the same time there is provided an enhancement to the electrical properties of the MCM interconnects, and an enhancement for the removal of heat generated under the MCM. This also reduces the need for costly sorting the PBC boards and at the same time, reduces the added expense for the costly machining of the MCM structures. Thereby the tolerances needed for assembly can be relaxed and the total cost for the completed system reduced.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
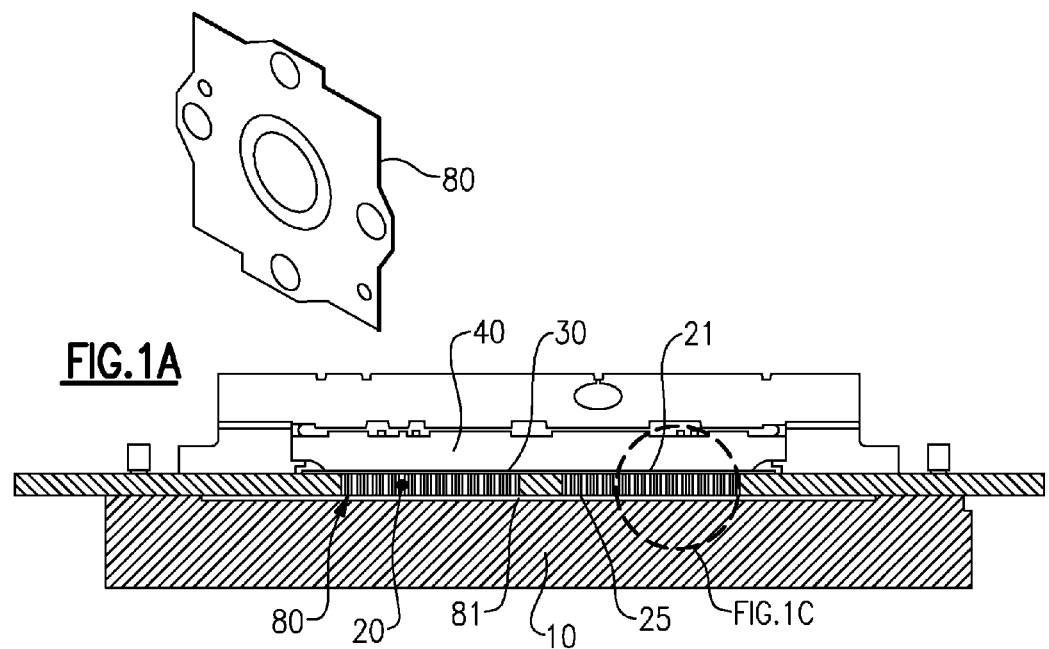
FIG. 1a illustrates one example of the irregularities formed between the system board and the mechanical stiffener with standard stacked insulators under board.
Figure 1B:
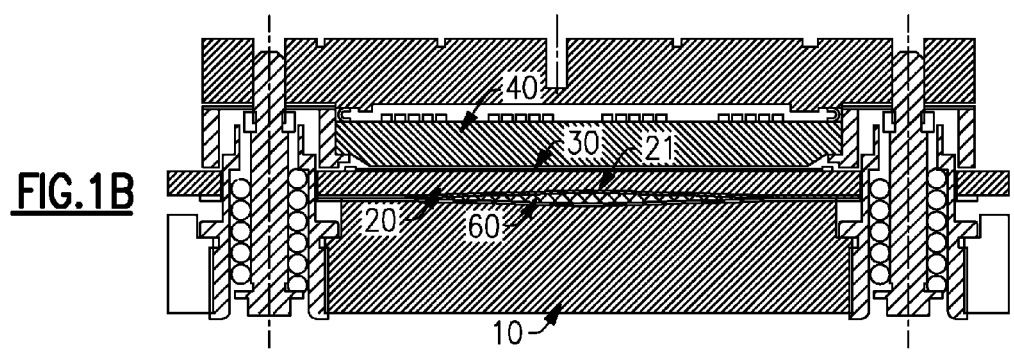
FIG. 1b illustrates one example of the irregularities formed between the system board and the mechanical stiffener filled with non-compressible gel package.
Figure 1C:
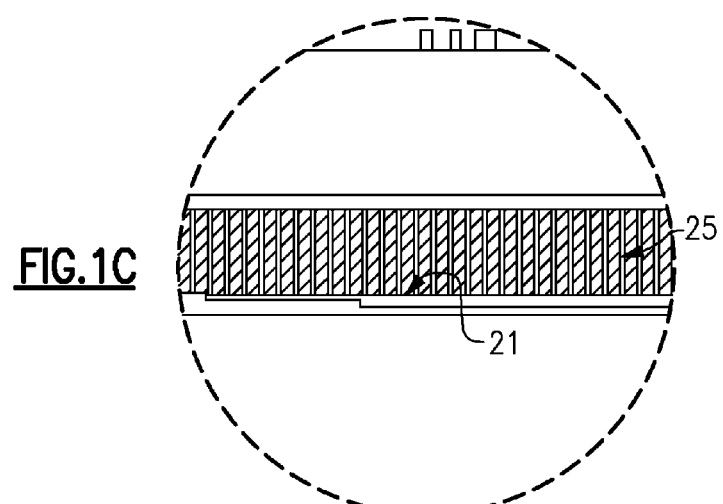
FIG. 1c illustrates in detail the irregularities formed between the system board and the mechanical stiffener with standard stacked insulator under board.

As shown in FIG. 1a, the current assembly technique requires an insulator (80) and pad stack (81) under the LGA (30) contact pattern field that is between the system board (20) and the stiffener (10). The PCB board (20) in this example has a concave or dish shape (21) in the LGA mounting area. This unevenness or dish shape (21) is created during the manufacture process of the board and its shape and size is partially due to the board's power/signal cross section. The change in thickness is also dependent on the number of vias (25) and cross supports designed into the board. As can be seen in the detail FIG. 1c there is a stair case effect as the insulators are stack upon each other. As the density of the vias (25) increase, so will change the height of the gap. The solution to the previously described problem would be to replace the insulator (80) and pad stack (81) with a non-compressible gel package (60) as shown in FIG. 1b. This would then insulate the system board (20) from the stiffener (10) as well as to provide a mechanical supporting structure that conforms to all irregularities between the system board (20) and the stiffener (10).

Figure 2A:
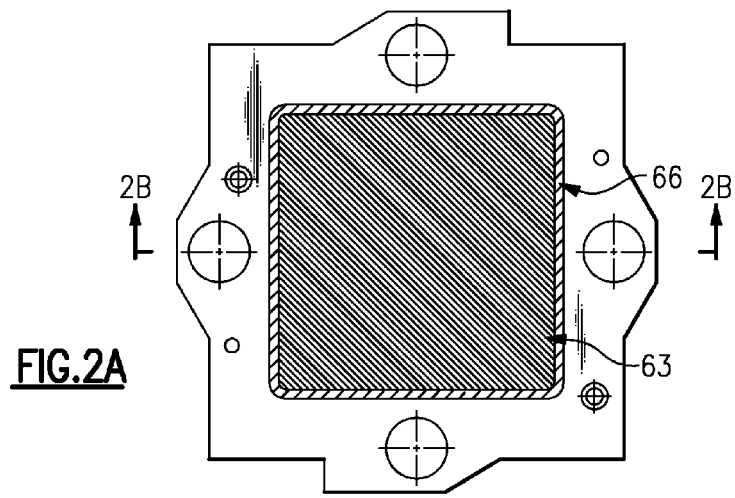
FIGS. 2a and 2b illustrate one preferred embodiment of the insulating gel package.
Figure 2B:
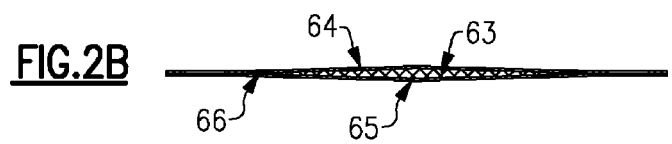

With the proposed solution, the gap (21) between the stiffener (10) and the system board (20) is filled with a self-conforming insulator structure (60) shown in FIGS. 2a and 2b that is shaped like a cushion. This cushion (60) comprises of two separate layers (64, 65) of insulating material. FIGS. 2a and 2b this insulating material is a material such as Mylar or Kapcon envelope is filled with non-compressible gel paste material such as a silicone gel or resin, thermo-conducting paste, or epoxy resin like substance (63) that conforms to all the irregularities and applies equal contact pressure on the board surface after assembly. The gel or resin material (63) can in a preferred embodiment be comprised of a low temperature-curing epoxy so that it would harden when it is heated by the temperature rise of the board in the powered on system. At a later time, a new cushion (60) would be used if the board (20) were to be removed from the stiffener (10). The advantage of this embodiment, in its several alternative embodiments is to enhance the overall structure of the MCM-LGA-system board-stiffener design such that there was an enhancement to the electrical properties of the interconnects, and an enhancement for the removal of heat generated under the MCM. The application will also reduce the costly sorting the PBC boards and at the same time, the costly machining of the MCM structures of the tolerances needed for assembly could be relaxed. Thus the total cost for the completed system would be reduced.

As will be seen in various embodiments of the non-compressible gel paste formulated for the purpose from non-compressible gel paste material such as a silicone gel or resin, thermo-conducting paste, or epoxy resin like substance (63) that conforms to all the irregularities and applies equal contact pressure on the board surface after assembly, the gel paste (could be a gel or pasty viscosity) compensates for the irregular thickness changes due to the design of the system board. With the gel package we fill the resulting gap between the system board and its supporting mechanical stiffener with a package of non-compressible gel or suitable insulating substance. This insulator package consists of a lamination of two sheets of films to form the envelope, such as films of Kapcon or Mylar materials that encompasses and envelopes a non-compressible insulating substance such as the thermo paste. In the preferred embodiment this is held within a supporting frame. The resulting package is used between the system board and the supporting mechanical hardware presently known as a stiffener or mechanical stiffener. The advantage of this solution is the fact that all the gaps created by the design of the system board are filled independent of a fixed separation dimension or if there are multiple gaps of different sizes. As the preferred embodiment illustrated in FIGS. 2a and 2b shows, in order to compensate for the irregular thickness changes due to the design of the system board, we provide the package (60) which still comprises two laminates (64, 65) that are supported and held together using a frame (66). Between the two insulating layers there is a deposit of a non-compressible material (63) such as thermo paste or an uncured epoxy. The design of this FIG. 2a-2b package (60) can use the same design as that of the LGA connector system shown in FIG. 1b and FIG. 3 to help facilitate assembly with this embodiment's application. The frame (66) (one or two elements of the framework) can have a squeeze zone within the weld area to provide a small relief area for the gel paste when compression occurs. This alternative is shown by the line in FIG. 2a around the gel paste area of frame (66). The application is in support of but not limited to the presently described alternative embodiment. It is anticipated that also, as an example, it could be used as an insulating shock mount between dissimilar structures to compensate for mechanical movement and design mismatching.

Figure 3:
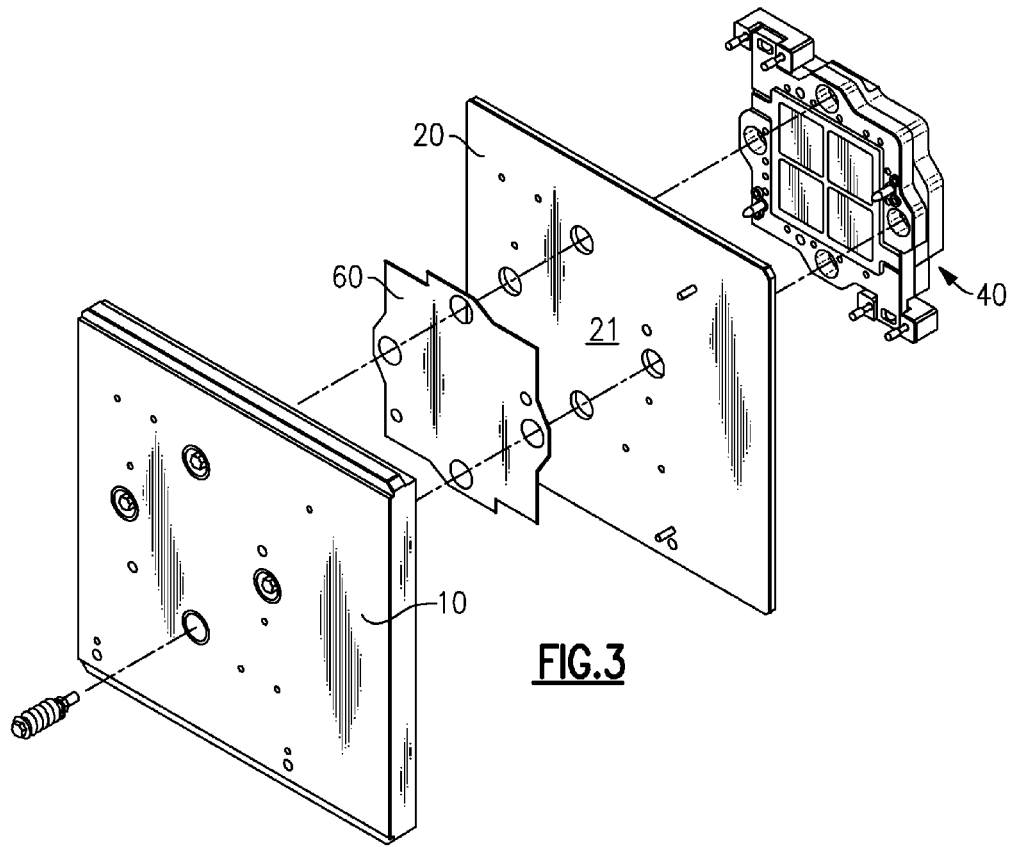
FIG. 3 illustrates one example of an exploded view of the complete assembly.

FIG. 3 shows the exploded view of the complete structure of board (20), stiffener (10), MCM (40) and one example of the compliant gel package structure (60).

DESCRIPTION

Figure 4A:
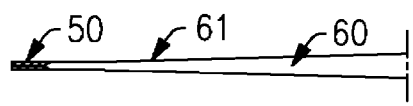
FIG. 4a illustrates one example of the gel package using a double frame for holding the gel package.
Figure 4B:
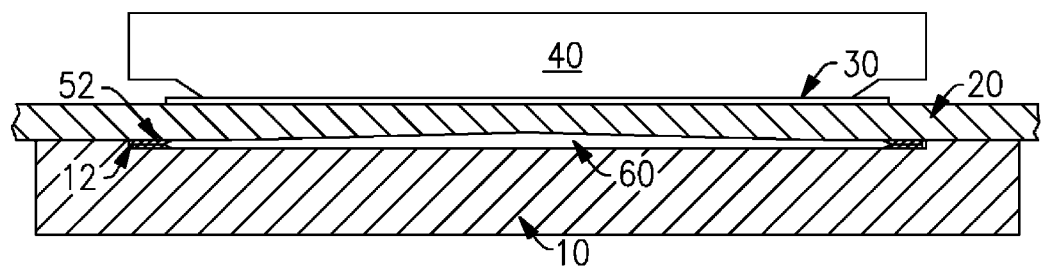
FIG. 4b illustrates one example of the gel package using a double frame for holding the gel package as used in the system.

For the design of the load-compensating gel package (60), attention must be given on how the excess volume of non-compressible material (63) is handled as well as providing structural integrity of the gel package (60). There are several methods that can be used. The first is as follows. Referring to FIG. 4a, the construction of the package is such that the outer frame of the package is designed to be slightly less in height as the crown of the gel compensator. The frame design (50) is such that the thickness of the frame is equal on both sides of the gel package (60). When the gel compensator (60) is installed between the stiffener (10) and the system board (20) and is compressed by the combination of the MCM (40) and the LGA (30), the excess gel will expand to the stop plates (52) on the outer frame (50). The over all design of this frame is such that a stand off of 0.008 inches is pre-determined. Thus, the gel package with a total height of 0.010 inches at its center is used; the elliptical shape of the package (61) seen in FIG. 2b would then re-form into the shape shown in FIG. 4b. The stiffener (10) would be machined such that there was a small step down (12) in the LGA area to house the gel package (60) and so that support would be provided to the system board (20) wherever it was needed.

Figure 5A:
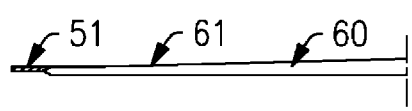
FIG. 5a illustrates one example of the gel package using a single frame for holding the gel package.
Figure 5B:
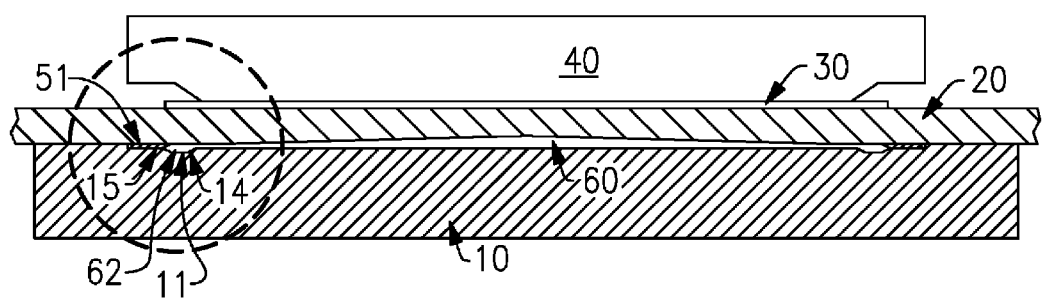
FIG. 5b illustrates one example of the gel package using a single frame for holding the gel package as used in the system with micro channel.
Figure 5C:
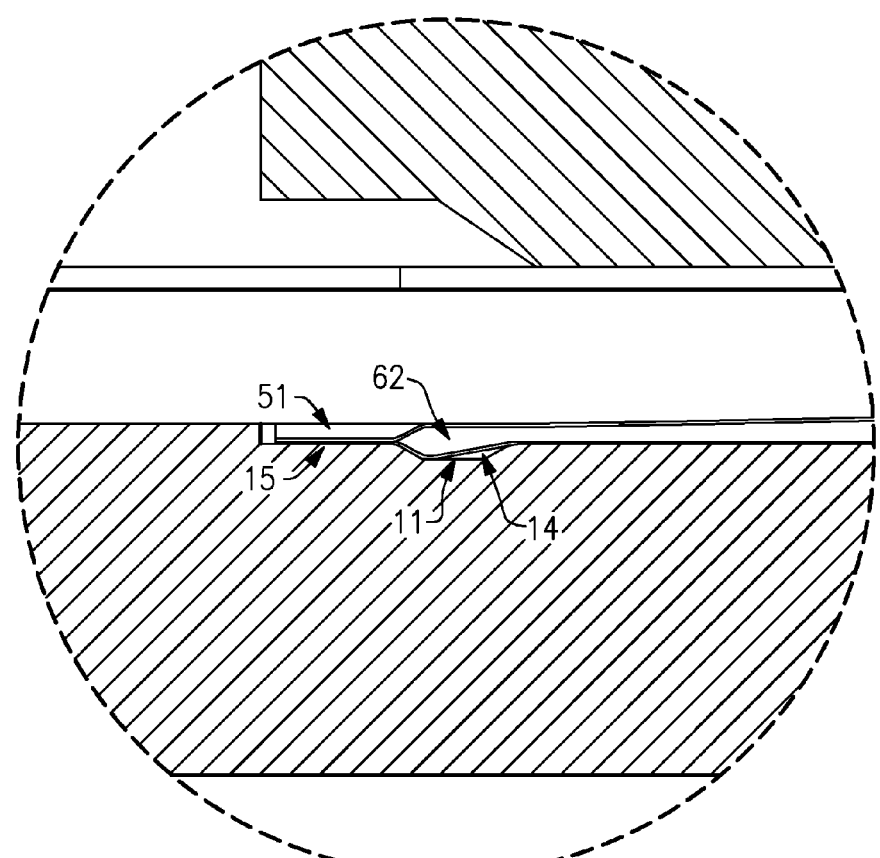
FIG. 5c illustrates a detail of the expansion channel.

Another design would use a gel package (60) that is constructed in a manner with the frame (51) on one side of the gel package (60) for support as shown in FIG. 5a. The advantage of this design would be for overall manufacturing considerations. The stiffener (10) would then be milled such that a channel (11) is formed in the area between the LGA connector area and the outer most clamping area of the frame as shown in FIG. 5b. The step (15) created with the milling of the small channel (11) would act as part of the gel package's (60) frame. As shown in FIG. 5c the gel package (60) is compressed during the mounting of the MCM (40), the excess gel material (62) would self level and fill the void (14) of the channel (11). The final results would also provide a solid backing to the system board (20). One advantage for the use of the channel would be to reduce the height needed between the stiffener (10) and the system board (20) and to permit a larger volume of gel (62) in the package (60).

Figure 6:
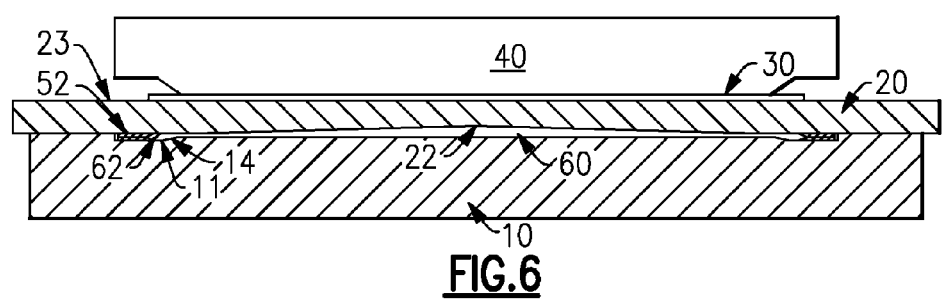
FIG. 6 illustrates one example of the gel package using a double frame for holding the gel package as used in the system with micro channel.
Figure 7:
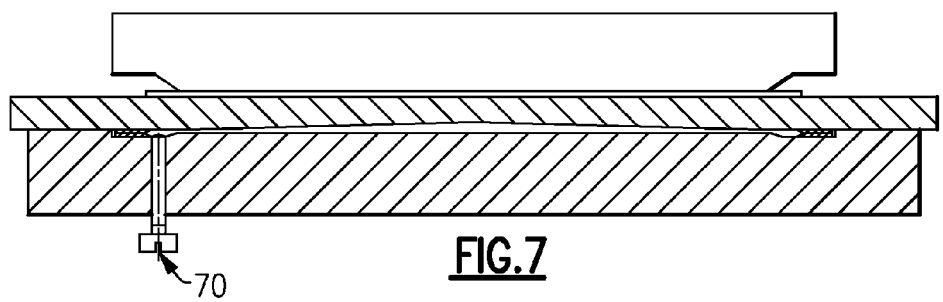
FIG. 7 illustrates one example of the gel package using a double frame for holding the gel package as used in the system with micro channel and screw for pressure/volume adjustment.

A third anticipated design shown in FIG. 6 would be to use the double frame compensator (50) as described in FIGS. 4a, b and the use of a channel (11) cut into the stiffener (10). The stiffener (10) is machined in such a manner that the system board (20) is supported outside of the LGA area, and a channel (11) is cut to completely frame the LGA support area. The frame (50) on the gel package (60) would then reside within this channel (11) and its height would be the same as the height of the stiffener (10) to the system board (20). When the MCM (40) is compressed to the front side of the system board (23), the gel would compensate for the uneven surface of the bottom side of the system board (22). The excess gel (62) would then fill the cavity (14) between the gel package frame (50) and the cut channel (11). Again a larger volume of material could be used in the design to cover a larger gap and thus permit a significant easement of the mechanical tolerances. An added embodiment to control the pressure and volume of the gel package is shown in FIG. 7. An adjustment screw (70) is incorporated in the stiffener (10) at one or at various locations around the gel package placement area. This would permit micro adjustments to the fluid system to insure that the gel or other such material is optimized for supporting the system board to stiffener interface. This technique would insure that a positive pressure of the gel package would be maintained.

To accommodate, if needed, the removal of excess heat generated under the MCM, the gel package could contain a thermo-conducting paste similar to the paste, which is used to interface the chips to the heat sink. When used with any of the previously defined applications, the paste would help to maintain a thermo-path to remove the excess heat to the stiffener. The reliability of the system of the system would be enhanced because the operational temperature of the MCM in the connector area would be in better control and therefore system speeds and reliability could be enhanced.

In certain applications, there might be an advantage to cause the gel package to form a permanent seal to the system board. This could be accomplished by using a low temperature curing epoxy as part of the gel package design. This could actually be a thermo-conducting epoxy. When the system is powered on, the temperature of the bottom side of the board will increase due to current through the vias and the heat sinking effects of the contacts between the MCM and the system board. This heat increase will then cause the resin to cure and harden in the conformed shape of the gap between the stiffener and the board providing for both an enhanced mechanical and thermo structure. In addition, the amount of the epoxy hardness could be regulated such that the epoxy could be as hard as possible or very elastic in nature. The higher the elasticity, the more rubber like the bond and thus the more flexible the adhesion. This would permit different applications of the epoxy when used in the proposed solution. This is especially important when the surfaces flex from the effects of temperature, or stress.

Figure 8:
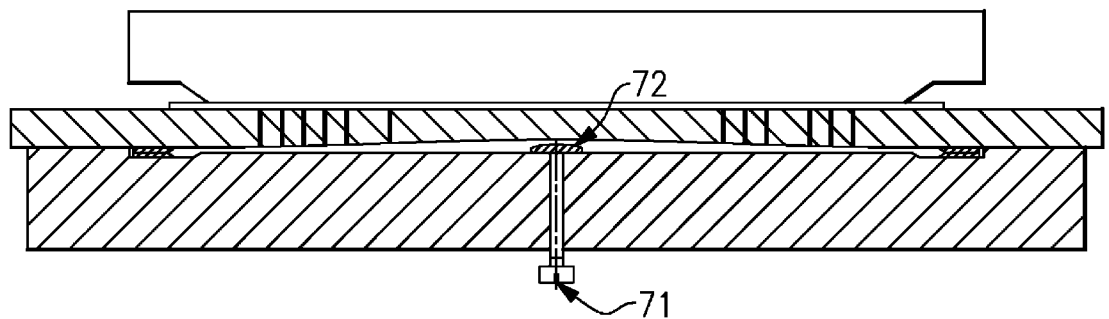
FIG. 8 illustrates one example of the gel package with an imbedded package of epoxy curing material and method for activation by a mechanical screw.

One concept would be to use an adjustment screw (71) as shown in FIG. 8 to activate a small package (72) of curing agent within the larger gel package. This could be accomplished by the use of a small sharp point attached to the inside of the outer layer (65) of the gel package (60). The curing agent package (72) would be placed as a decal over the sharp point during the assembly of the overall package (60). The decal could also contain the sharp activation point to enhance the assembly of the epoxy package (60). When the screw (71) is adjusted inward, the sharp point would then puncture the small package (72) of curing agent and thereby releasing it into the epoxy filled package (60). This would then cause the epoxy to harden and form a solid interface between the system board (20) and the stiffener (10). The epoxy could also have thermo conductive properties similar to that of a thermo conductive paste. This would permit the removal of excess heat from under the MCM during system operation and at the same time form a ridged support between the system board (20) and the stiffener (10).

Figure 9:
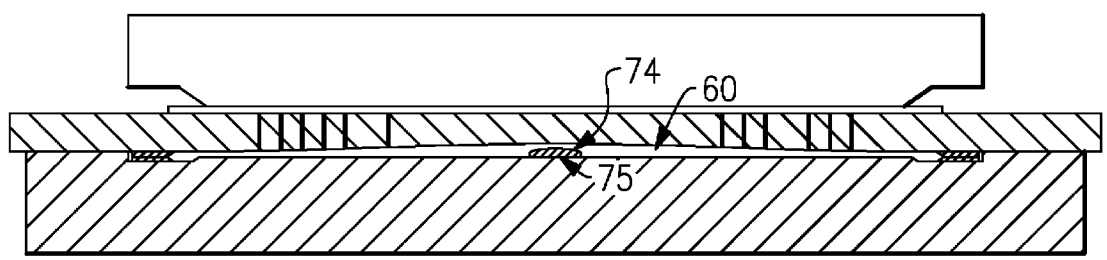
FIG. 9 illustrates one example of the gel package with an embedded package of curing material and method for activation by pressure from assembly forces.

Another concept, as shown in FIG. 9, would be to include within the gel package (60) an activation agent package (74) that would contain an epoxy-curing agent (75). This package (74) could be designed to rupture when the compression forces exceed a predetermined value during the assembly of the MCM to the system board (20) and stiffener (10). The agent (75) would then be injected into the epoxy package (60) and thereby causing the epoxy to harden into a solid form that would conform to the system board (20) irregularities.

A third concept would be to use a pressure sensitive curing epoxy that would self activate when subjected to pressure such as that created when the MCM (40) is compressed to the system board (20).

In addition to the mechanical activation of the curing agent as described in FIG. 8 and FIG. 9, the enclosed active curing agent (75) could be dispensed into the gel package (60) by physical manipulation of the gel package (60) by the assembler. That is to say, the operator would squeeze the gel package (60) by hand to cause the enclosed curing agent package (74) to rupture. This would permit the operator to inter mix the epoxy and curing agent together just before assembly, thereby insuring that the curing agent was well mixed with the epoxy.

The electrical interface between the MCM and the LGA connector is significantly enhanced due to the fact that the system board is uniformly supported in the LGA area. Because no movement is possible of the system board due heat flux of the PCB material, the LGA connectors are in the best possible contact with the MCM. With better contact of the LGA connectors being made, the contact resistance of the inner most LGA connections of the array will be lowered. With a lower signal amplitude loss for the signal nets and a lower drop in voltage and better power distribution for the power connections, the system performance can be improved. At the transmission rates for current and future machines, every impact due to power loss or signal integrity has an effect on the delivered system performance and thus the improvements made by this application will enhance system performance.

The retro fitting of the computer systems using an LGA connection interface could be accomplished through the use of any one of the described methods with little or no modifications. Ideally, the insulator that is presently being used on all LGA system designs would be replaced by a self-compensating gel package.

While the preferred embodiments to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for insulating a mechanical stiffener from a printed circuit board on which a multi-chip module (MCM) is to be mounted, to form an MCM package, the method comprising:
   mounting the multi-chip module to the printed circuit board against the mechanical stiffener with a non-compressible thermo-conducting gel package placed between the printed circuit board and the mechanical stiffener, the gel package being formed as a self-conforming insulator structure comprising a cushion, of two separate insulating layers of film, filled with a non-compressible thermo-conducting gel paste insulating material; and
   pressing the multi-chip module and the mechanical stiffener together to apply pressure to the gel package between the printed circuit board and the mechanical stiffener, thereby to cause compression between the printed circuit board and the mechanical stiffener to cause the gel package to conform to any irregularities and fill any voids between the printed circuit board and the mechanical stiffener;
   the mechanical stiffener being formed with a channel extending along a periphery of the gel package, whereby excess material resulting from compression of the gel package between the printed circuit board and the mechanical stiffener flows into the channel.

2. The method according to claim 1 wherein said gel package provides an insulating cushion between the printed circuit board and the mechanical stiffener.

3. The method according to claim 1 wherein said gel paste insulating material is in a package held together by a supporting framework holding said gel package together.

4. The method according to claim 3 wherein said gel paste insulating material is activated by a curing agent which is activated by heat.

5. The method according to claim 3 wherein said gel paste insulating material is activated by an activator released by a compression adjustment of a pin abutting said gel package rupturing an activator package in said gel package to release an activator of said gel paste insulating material into said gel package.

6. The method according to claim 3 wherein said gel paste insulating material is cured by a curing agent which is released from a package of said curing agent designed so that compression causes it to rupture.

7. The method according to claim 6 wherein the package of said curing agent is an activating package which causes the curing agent to be released into said gel package.

8. The method according to claim 3 wherein said gel paste insulating material is a thermosetting resin.

9. The method according to claim 8 wherein said thermosetting resin is a silicone resin.

10. The method according to claim 1 wherein said gel package is contained by a mechanical framework containing openings for alignment placement of said gel package in position between said printed circuit board and said mechanical stiffener for said multi-chip module.

11. The method according to claim 1 wherein said gel package is contained by a mechanical framework for alignment placement of said gel package in position between said printed circuit board and said mechanical stiffener for said multi-chip module.

12. The method according to claim 1 wherein said paste insulating material comprises a thermosetting resin formulated to be become stiff by the application of heat provided by said printed circuit board.

13. The method according to claim 1 where said insulating layers of said film enclose a curing agent for said gel paste insulating material.

* * * * *